(12) United States Patent
Park et al.

(10) Patent No.: US 12,069,820 B2
(45) Date of Patent: Aug. 20, 2024

(54) ROLLABLE DISPLAY DEVICE

(71) Applicant: LG ELECTRONICS INC., Seoul (KR)

(72) Inventors: Jaehoon Park, Seoul (KR); Jaekun Kim, Seoul (KR); Jaeyong Kim, Seoul (KR); Manin Baek, Seoul (KR); Hyunwoo So, Seoul (KR); Bosung Lee, Seoul (KR); Kwaneun Jin, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 257 days.

(21) Appl. No.: 17/629,989

(22) PCT Filed: Jul. 26, 2019

(86) PCT No.: PCT/KR2019/009321
§ 371 (c)(1),
(2) Date: Jan. 25, 2022

(87) PCT Pub. No.: WO2021/020595
PCT Pub. Date: Feb. 4, 2021

(65) Prior Publication Data
US 2022/0264755 A1 Aug. 18, 2022

(51) Int. Cl.
*H05K 5/00* (2006.01)
*H05K 5/02* (2006.01)

(52) U.S. Cl.
CPC ......... *H05K 5/0217* (2013.01); *H05K 5/0017* (2013.01)

(58) Field of Classification Search
CPC ............... H05K 5/0017; H05K 5/0217

USPC ........................... 361/807, 809, 810
See application file for complete search history.

(56) References Cited

U.S. PATENT DOCUMENTS

| 11,013,130 | B2 | 5/2021 | Shin et al. |
| 11,229,128 | B2* | 1/2022 | Kim ............... G02F 1/133305 |
| 2014/0173860 | A1 | 6/2014 | Yamada et al. |
| 2016/0224068 | A1* | 8/2016 | Choi ............... G06F 3/045 |
| 2016/0374228 | A1* | 12/2016 | Park ............... G09F 9/301 |
| 2017/0336831 | A1 | 11/2017 | Zhang et al. |
| 2018/0070466 | A1* | 3/2018 | Kim ............... H05K 5/0247 |
| 2018/0070467 | A1 | 3/2018 | Kim et al. |

(Continued)

FOREIGN PATENT DOCUMENTS

| JP | 200946820 | * | 3/2009 | ............... E04B 1/94 |
| KR | 10-1945985 | B1 | 2/2019 | |
| KR | 10-2019-0023919 | A | 3/2019 | |

(Continued)

*Primary Examiner* — Hung S. Bui
(74) *Attorney, Agent, or Firm* — Birch, Stewart, Kolasch & Birch, LLP

(57) ABSTRACT

A rollable display device according to one aspect of the present invention comprises: a roller; a display unit which is rolled around the roller, and which comprises a display panel and a module cover that is laminated on the display panel so as to face same; a link assembly for moving the display unit upward and downward; and a motor assembly for driving the link assembly, wherein the module cover can comprise: a module cover having a yield strain of 0.5% or higher; and a film part which is laminated on the module cover and which has an elongation rate higher than that of the module cover.

16 Claims, 16 Drawing Sheets

(56) References Cited

U.S. PATENT DOCUMENTS

2019/0207141 A1  7/2019  Kim et al.

FOREIGN PATENT DOCUMENTS

KR          10-1975188  B1   5/2019
KR     10-2019-0076284  A    7/2019

* cited by examiner

[FIG. 1]
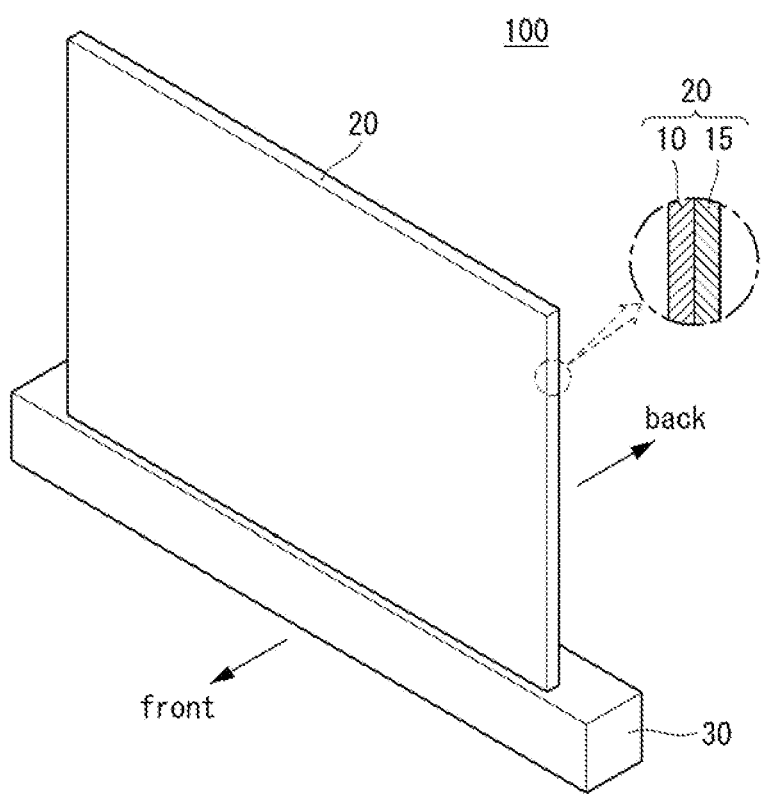

[FIG. 2]
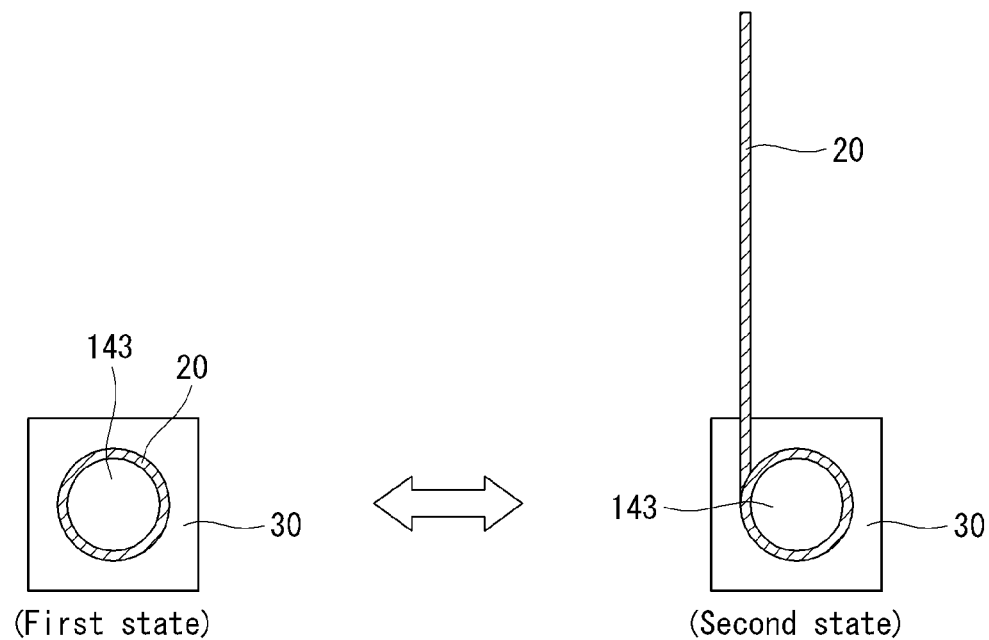
(First state)      (Second state)

[FIG. 3]
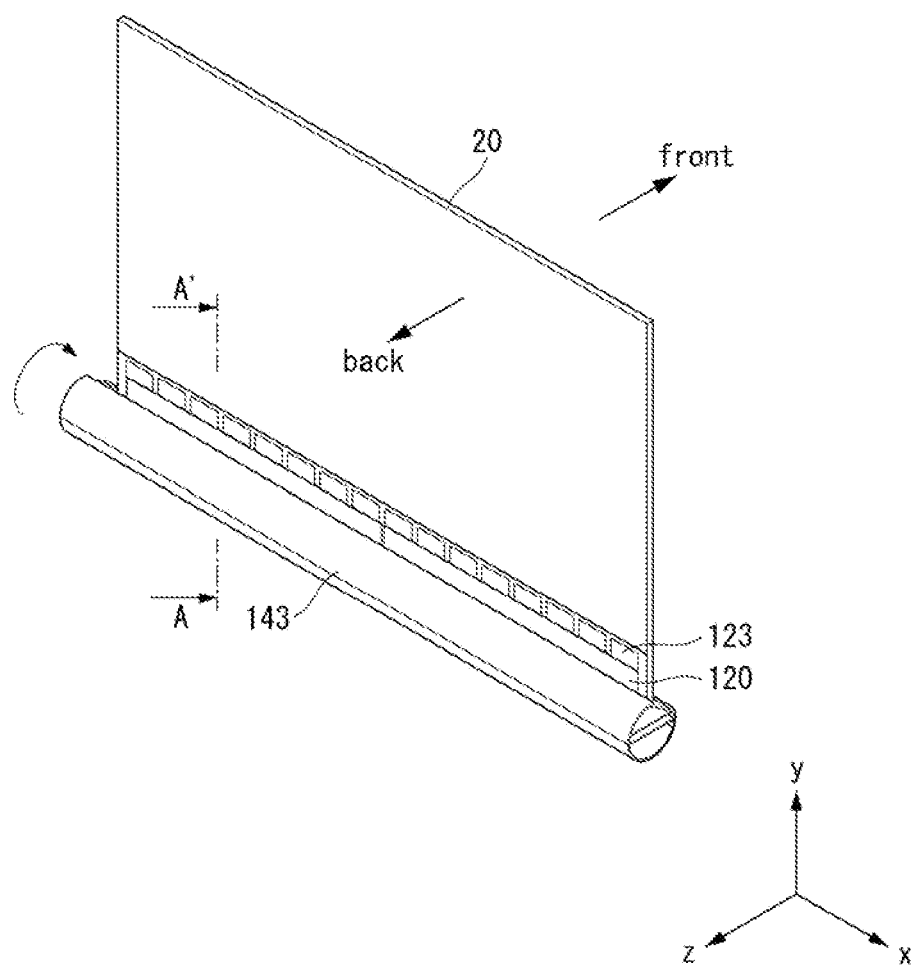

[FIG. 4]
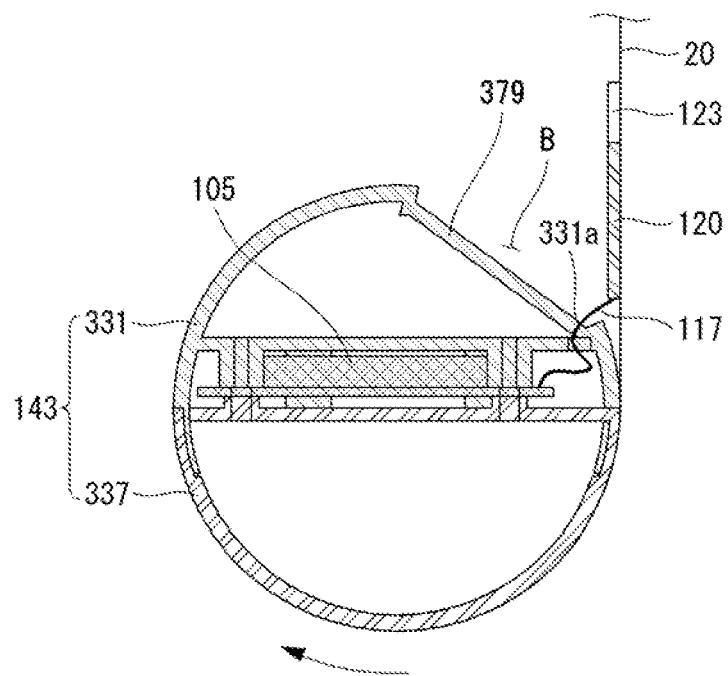

[FIG. 5]
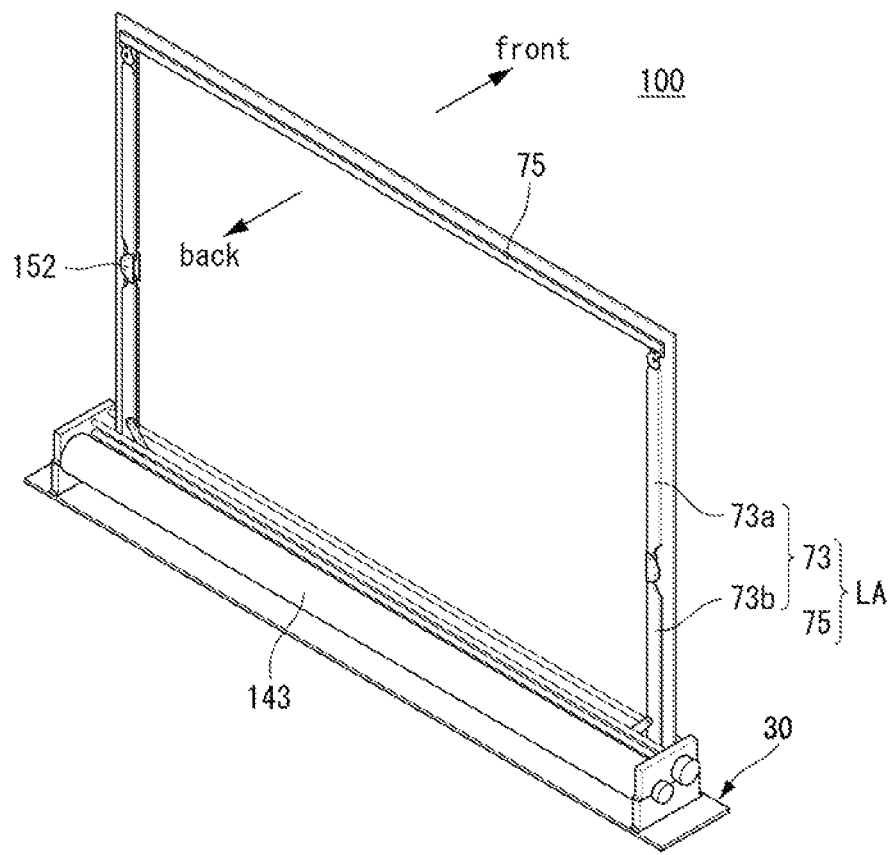

[FIG. 6]
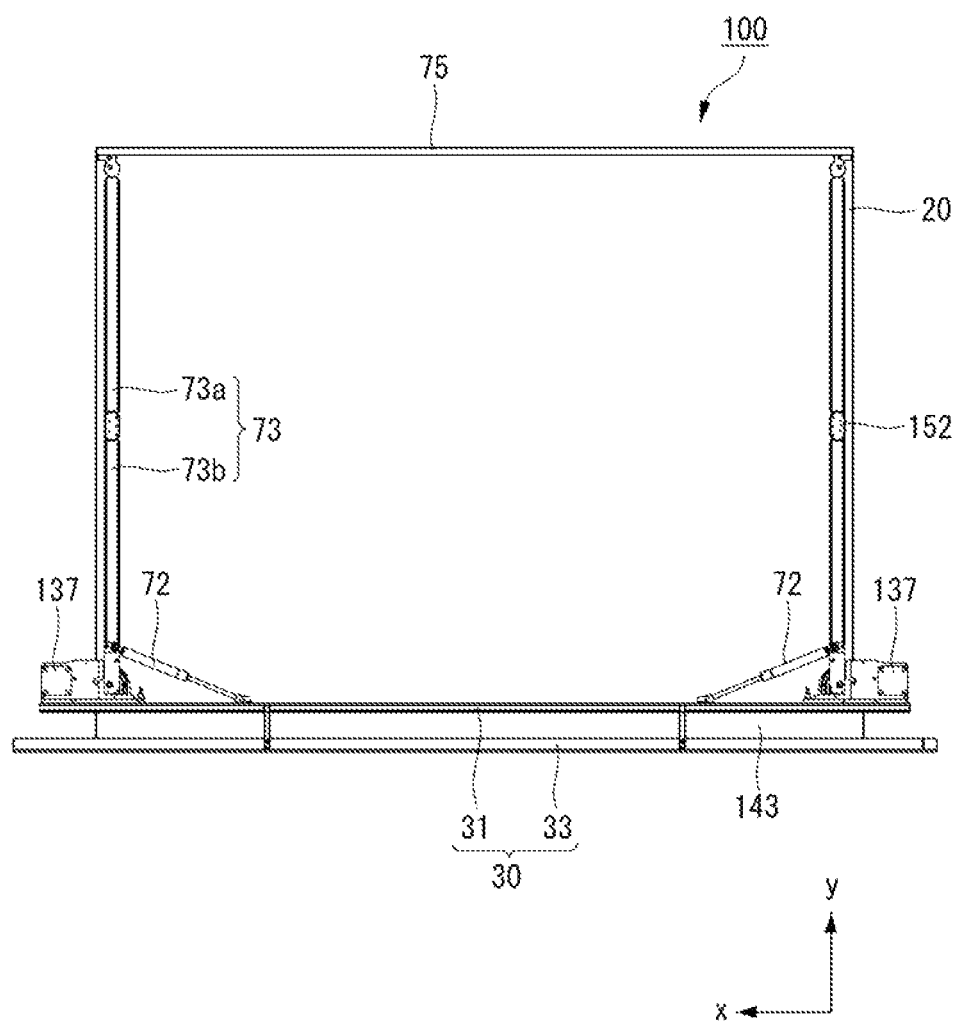

[FIG. 7]
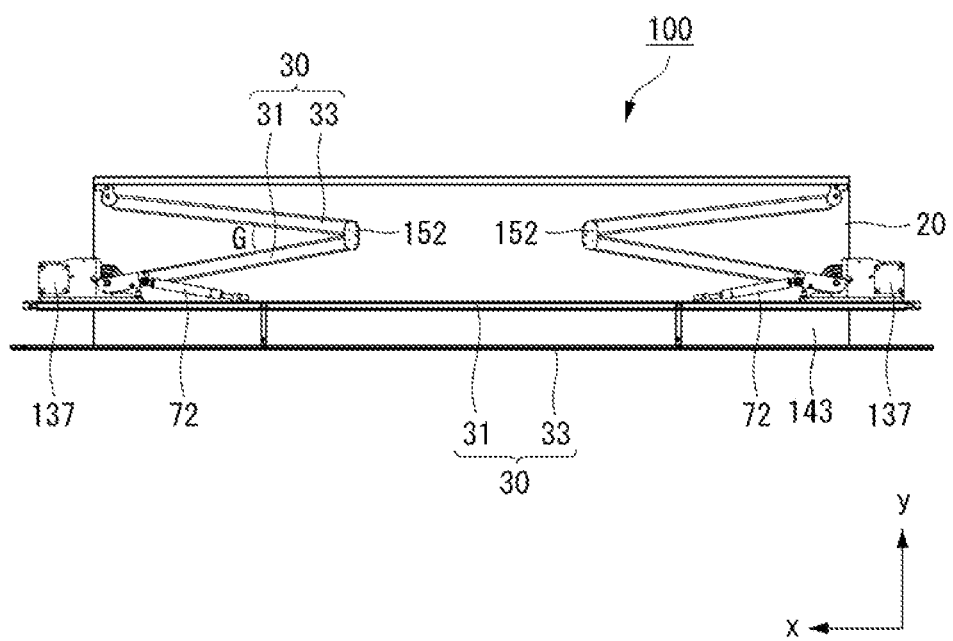

[FIG. 8]
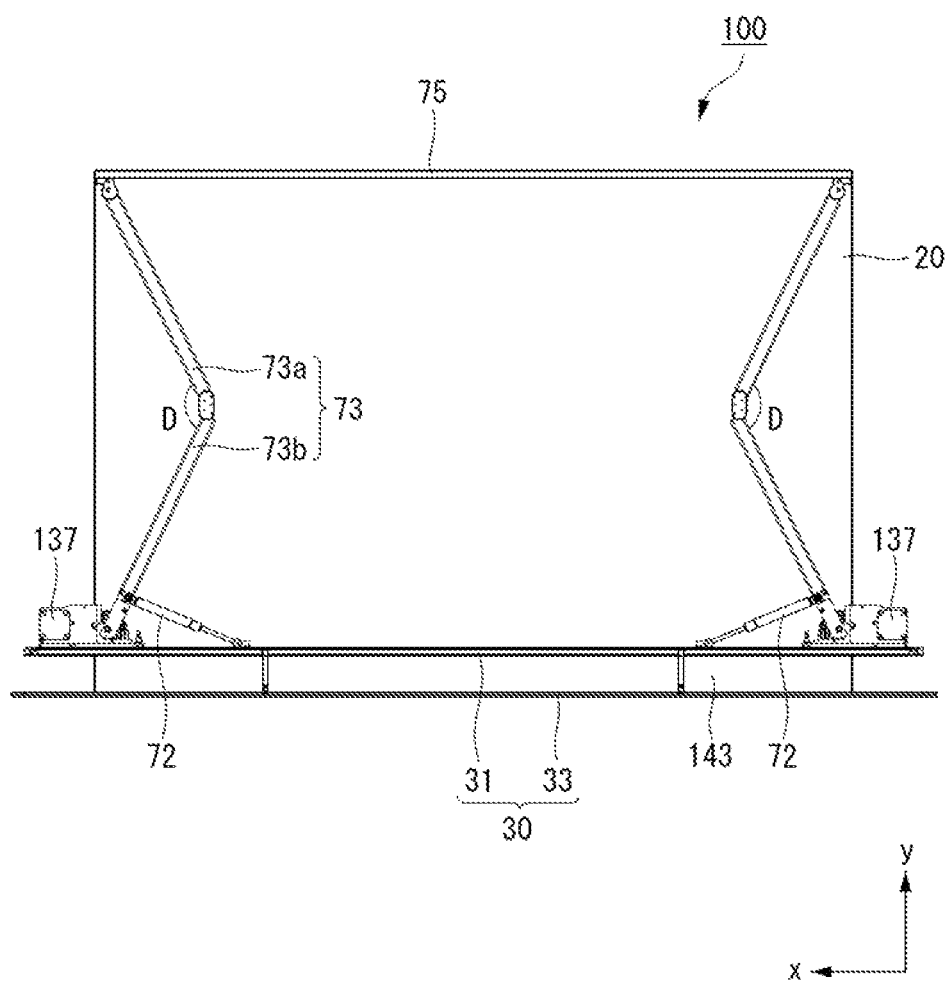

[FIG. 9]
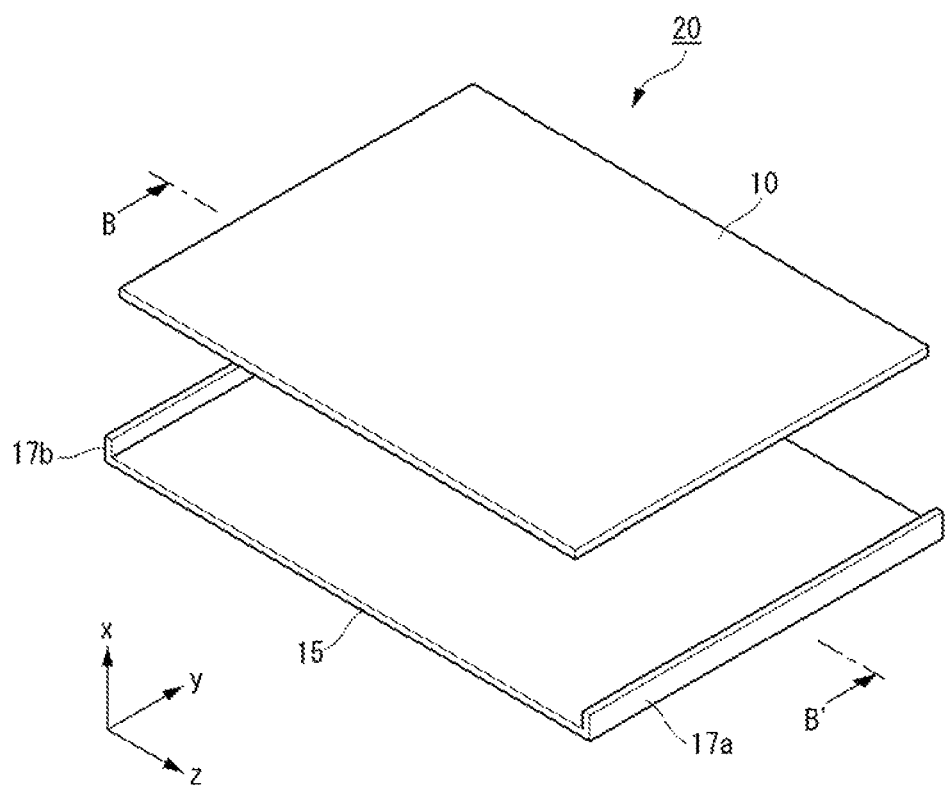

[FIG. 10]
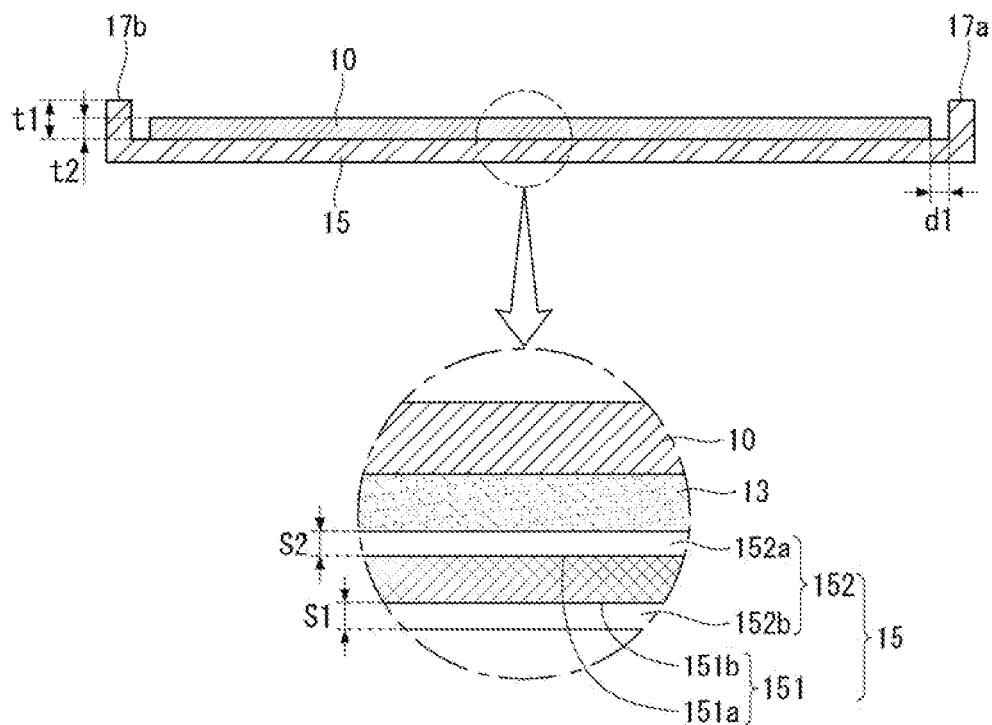

[FIG. 11]
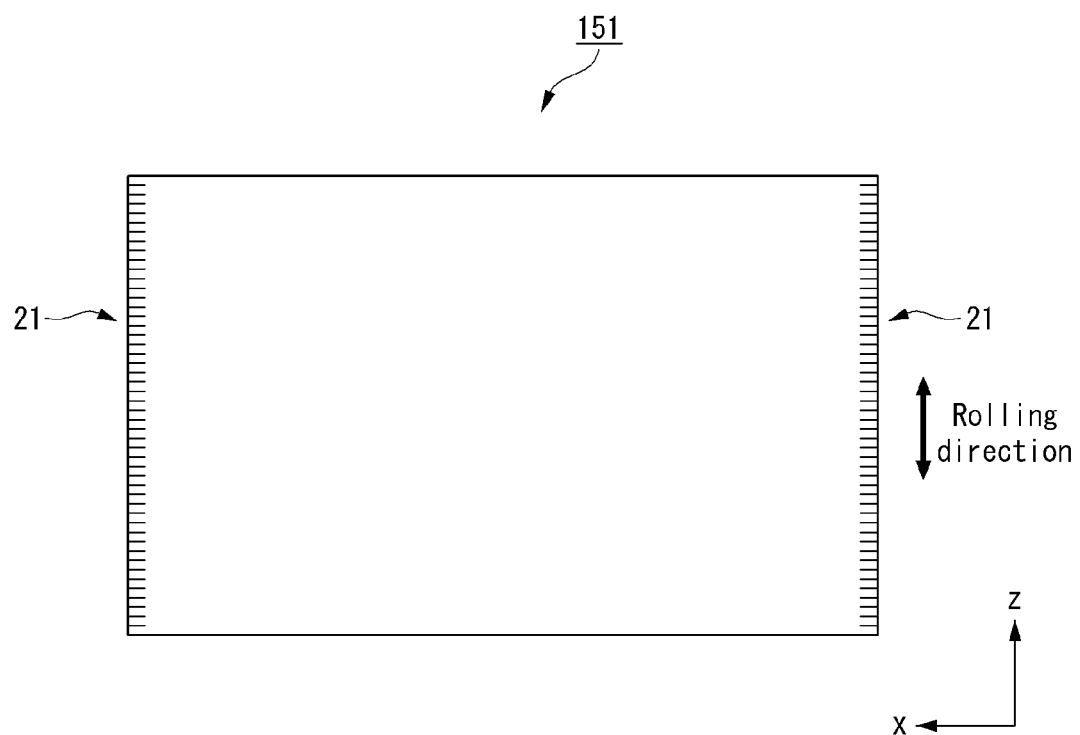

[FIG. 12]
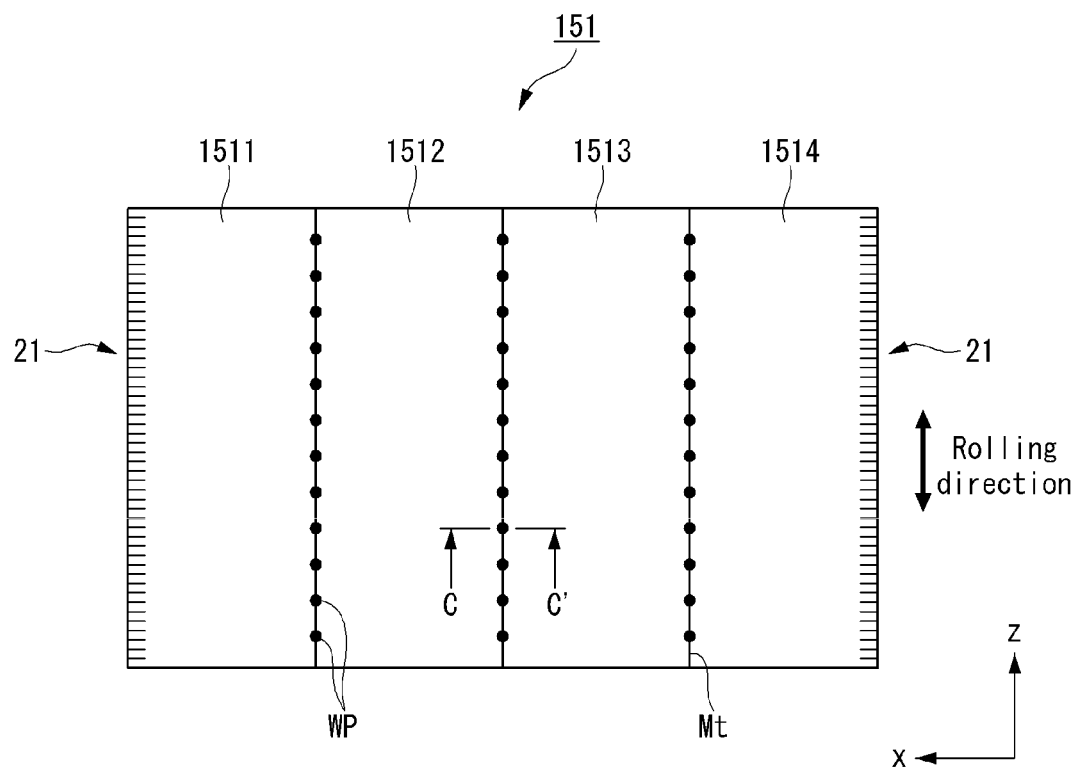
[FIG. 13]
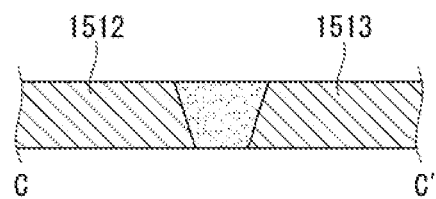

[FIG. 14]
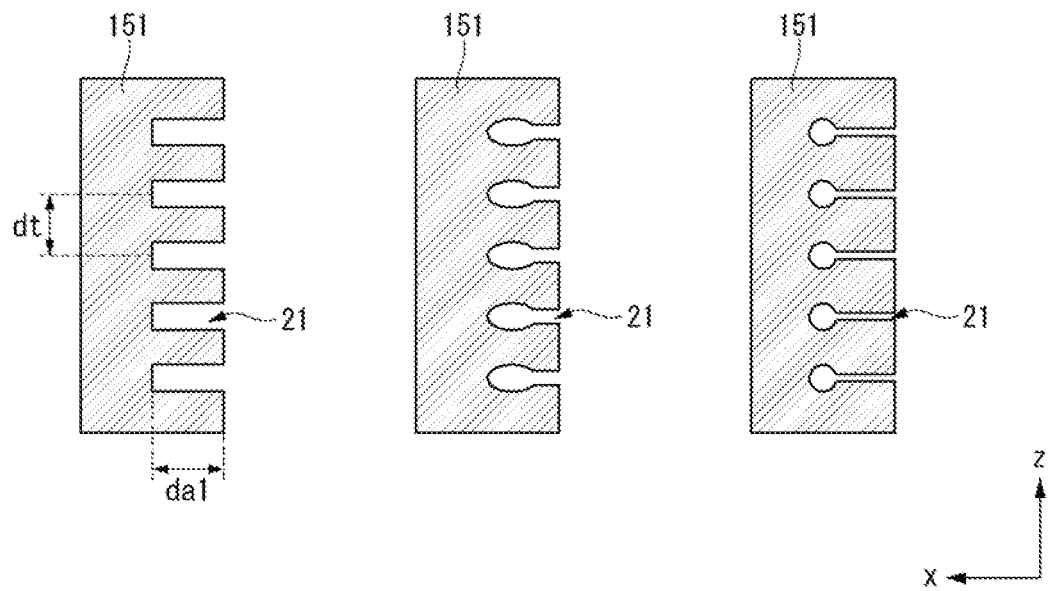
[FIG. 15]
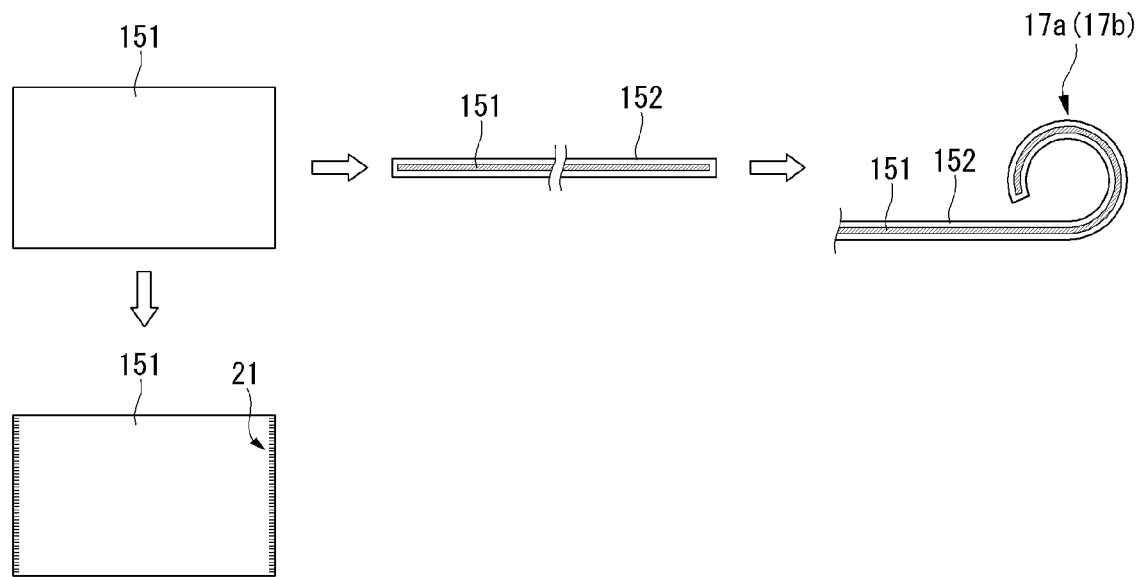

[FIG. 16]
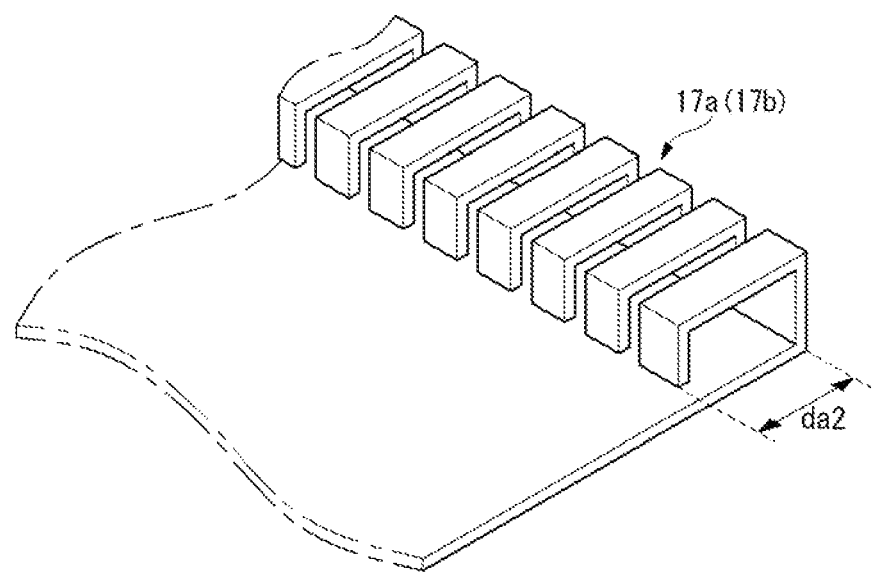

[FIG. 17]
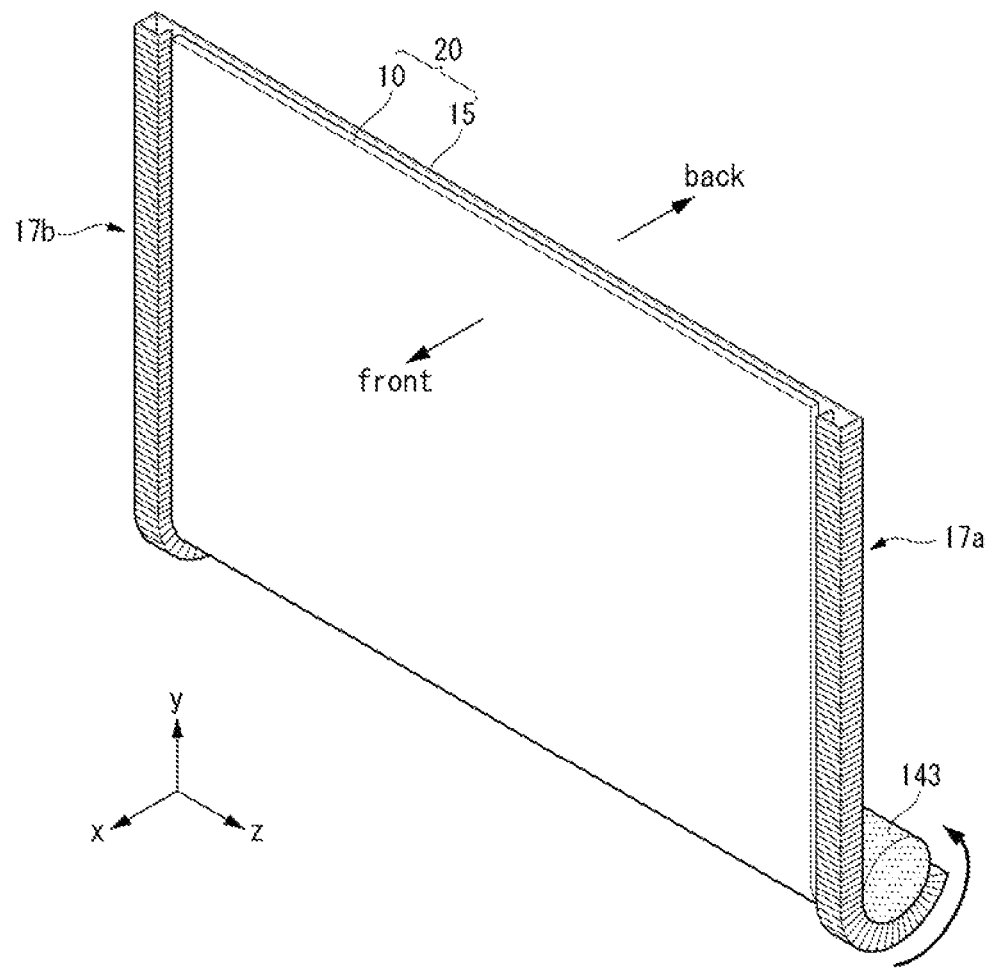

[FIG. 18]
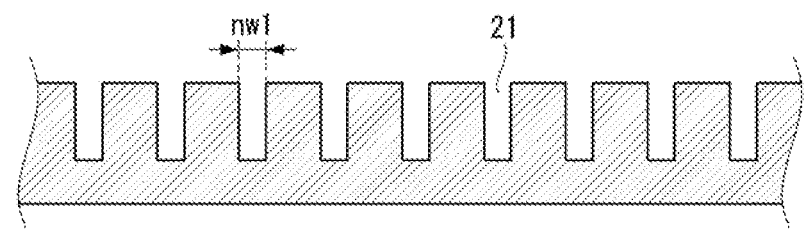
(A)
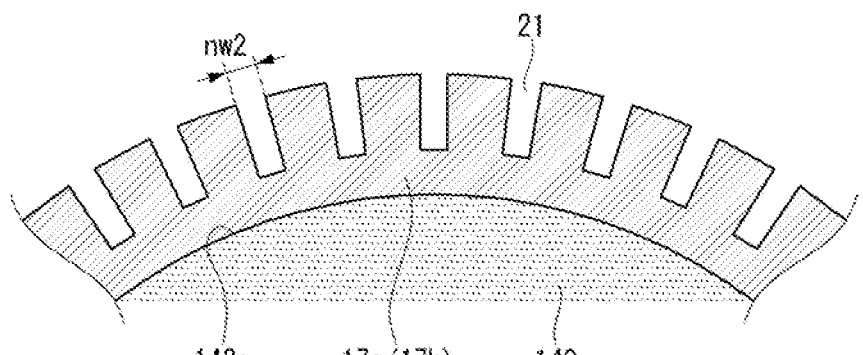
(B)

ROLLABLE DISPLAY DEVICE

CROSS REFERENCE TO RELATED APPLICATIONS

This application is the National Phase of PCT International Application No. PCT/KR2019/009321, filed on Jul. 26, 2019, all of which is hereby expressly incorporated by reference into the present application.

TECHNICAL FIELD

The present disclosure relates to a rollable display device in which a display is rolled.

BACKGROUND ART

With the development of information society, the demand for display devices is increasing in various forms. To meet this demand, various types of display devices such as liquid crystal displays (LCDs), plasma display panels (PDPs), electroluminescent displays (ELDs), and vacuum fluorescent displays (VFDs), have been recently studied and used.

Among these display devices, a display device using organic light emitting diodes (OLEDs) has advantages of better luminance characteristics and better viewing angle characteristics compared to the liquid crystal display, and in that it can be implemented as an ultra-thin and flexible display device since it does not require a backlight unit.

Moreover, the flexible display can be applied and used in various fields. For example, the flexible display may be implemented as a rollable display device that can be unrolled when a display is in use and that can be rolled up and kept in storage when the display is not in use.

DISCLOSURE

Technical Problem

An object of the present disclosure is to address the above-described and other problems.

Another object of the present disclosure is to provide a module cover capable of being used in a rollable display and a rollable display device including the same.

Technical Solution

An object of the present disclosure is to address the above-described and other problems.

Another object of the present disclosure is to provide a module cover capable of being used in a rollable display and a rollable display device including the same.

Advantageous Effects

Effects of a display device according to the present disclosure are described as follows.

According to at least one embodiment of the present disclosure, the present disclosure can enhance aesthetic feeling since a display panel is supported by a display unit with a thin thickness, and can reduce a size of a roller, on which the display unit is rolled, to implement a slim device.

According to an embodiment of the present disclosure, the present disclosure can efficiently protect a display unit weak to an impact since the display unit includes a bezel.

Additional scope of applicability of the present disclosure will become apparent from the detailed description given blow. However, it should be understood that the detailed description and specific examples such as embodiments of the present disclosure are given merely by way of example, since various changes and modifications within the spirit and scope of the present disclosure will become apparent to those skilled in the art from the detailed description.

DESCRIPTION OF DRAWINGS

FIG. 1 simply illustrates an overall appearance of a rollable display device according to an embodiment of the present disclosure.

FIG. 2 illustrates an operation of a rollable display device.

FIG. 3 illustrates an appearance of a display unit connected to a roller.

FIG. 4 schematically illustrates a cross-section taken along line A-A' of FIG. 3.

FIG. 5 illustrates an overall appearance of a rollable display device according to an embodiment.

FIG. 6 illustrates an appearance of the rear of a rollable display device of FIG. 5.

FIGS. 7 and 8 illustrate a link assembly in a folded state.

FIG. 9 illustrates an appearance of a display unit configured to roll according to an embodiment.

FIG. 10 illustrates a cross-section taken along line B-B' of FIG. 9.

FIGS. 11 and 12 illustrate a planar appearance of a module cover constructing a module cover.

FIG. 13 illustrates a cross-section taken along line C-C' of FIG. 12.

FIG. 14 enlargedly illustrates selectively an end at which a notch of a module cover is formed.

FIG. 15 illustrates a process of forming a bending portion.

FIG. 16 partially illustrates a bezel portion formed through a bending processing.

FIG. 17 illustrates an assembly of a display unit and a roller.

FIG. 18 illustrates a notch formed in a bezel portion when a display unit is rolled on or unrolled from a roller.

BEST MODE

Reference will now be made in detail to embodiments of the disclosure, examples of which are illustrated in the accompanying drawings. Wherever possible, the same reference numbers will be used throughout the drawings to refer to the same or like parts. In general, a suffix such as "module" and "unit" may be used to refer to elements or components. Use of such a suffix herein is merely intended to facilitate description of the present disclosure, and the suffix itself is not intended to give any special meaning or function. It will be noted that a detailed description of known arts will be omitted if it is determined that the detailed description of the known arts can obscure the embodiments of the disclosure. The accompanying drawings are used to help easily understand various technical features and it should be understood that embodiments presented herein are not limited by the accompanying drawings. As such, the present disclosure should be construed to extend to any alterations, equivalents and substitutes in addition to those which are particularly set out in the accompanying drawings.

In addition, in the drawings, for a simplified illustration according to selection, configuration of each component may be expressed slightly differently according to figures, but the same reference numerals represent the same components.

Hereinafter, a display panel will be described by taking an organic light emitting diode (OLED) display panel as an example. However, the display panel applicable to the present disclosure is not limited to a liquid crystal display panel and may include flat panel displays that are configured to roll, such as a liquid crystal display (LCD) panel, a plasma display panel (PDP), or a field emission display (FED) panel.

With reference to FIGS. 1 and 2, an overall appearance and an operation of a rollable display device according to an embodiment of the present disclosure are described below. FIG. 1 simply illustrates an overall appearance of a rollable display device according to an embodiment of the present disclosure, and FIG. 2 illustrates an operation state of the rollable display device.

Referring to FIGS. 1 and 2, a rollable display device 100 according to an embodiment may include a display unit 20 and a housing 30.

The display unit 20 may be configured to display an image and may include a display panel 10 and a module cover 15.

The display panel 10 may be provided at a front surface of the display device 100 and may display an image. The display panel 10 may split an image into a plurality of pixels and output the image by controlling each pixel to emit light while adjusting color, brightness, and saturation of each pixel. The display panel 10 may be divided into an active region where an image is displayed and an inactive region where no image is displayed.

The display panel 10 may have a rectangular shape. However, the present disclosure is not limited thereto, and the display panel 10 may be shaped to have a predetermined curvature at an edge. The display panel 10 may be an organic light emitting diode (OLED) display panel in an exemplary embodiment. However, the present disclosure is not limited thereto, and the display panel 10 may be various types of flexible flat panel displays.

The module cover 15 may be provided at a rear surface of the display panel 10. The module cover 15 may be attached directly to the display panel 10. A size of the module cover 15 may be equal to or greater than a size of the display panel 10.

The module cover 15 may support the display panel 10 and may be attached directly to the rear surface of the display panel 10 while the module cover 15 faces the display panel 10 in a face-to-face manner so that the display panel 10 is stably rolled. In an exemplary embodiment, the module cover 15 may be attached to the display panel 10 by an adhesive having a given strength or higher once it is cured. As a result, the display panel 10 and the module cover 15 may form one assembly and operate as one body.

The module cover 15 may be configured to move up and down the display unit 20 and may be folded or unfolded depending on the direction. The module cover 15 will be described in detail later.

The housing 30 may accommodate the display panel 10 and may also mount multiple mechanical components for moving up and down the display unit 20 and driving circuits required to drive the display unit 20 therein.

The rollable display device 100 may operate in a first state and a second state. The first state is a state in which the active region of the display unit 20 is positioned inside the housing 30, and the second state is a state in which the active region of the display unit 20 is exposed out of the housing 30. Alternatively, the first state may be a state in which the display unit 20 is accommodated inside the housing, and the second state may be a state in which the display unit 20 is unrolled.

When the rollable display device 100 is in the first state, the active region of the display unit 20 may be positioned inside the housing 30. That is, this indicates that the display unit 20 may be shielded by the housing 30.

The rollable display device 100 maintains the first state when it does not operate or no screen appears on the display, and maintains the second state when it operates or a screen appears on the display.

In an embodiment, the rollable display device 100 may further include a roller 143 for moving up and down the rollable display device 100. The roller 143 is configured to rotate clockwise or counterclockwise inside the housing 30. One end of the display unit 20 is connected to the roller 143, and may be unfolded out of the housing 30 or accommodated in the housing 30 while the display unit 20 moves up and down by a rotary motion of the roller 143.

Alternatively, the display unit 20 is rolled on the roller 143 in the first state, and the display unit 20 is unrolled from the roller 143 and exposed in the second state. A detailed structure and operation method of the roller and the display unit 20 are described below.

As described above, in the rollable display device 100 according to an embodiment, the display unit 20 may be in either the first state or the second state. Hence, since the display unit 20 can be exposed out of the housing 30 only when the display device 100 is in use, a space can be saved.

With reference to FIGS. 3 and 4, the arrangement of the display unit 20 and the roller 143 is described in detail below. FIG. 3 illustrates an appearance of a display unit connected to a roller, and FIG. 4 schematically illustrates a cross-section taken along line A-A' of FIG. 3.

Referring to FIGS. 3 and 4, in the rollable display device according to an embodiment, the roller 143 may be connected to one end of the display panel 10. The roller 143 may wind or unwind the display panel 10 so that the display panel 10 is in either the first state or the second state. The roller 143 may be configured to move up the display unit 20 by rotating in the arrow direction (clockwise) and move down the display unit 20 by rotating counterclockwise. In an example, when the roller 143 operates as described above, the display unit 20 may be disposed in such a way that the 'front' is a direction directed toward −z-axis and the 'back' is a direction directed toward +z-axis. In this case, the display unit 20 may be wound in such a way that the front of the display unit 20 displaying the image is directed toward the outward of the roller 143. When the display unit 20 moves up out of the housing 30 by winding or unwinding the display unit 20 as described above, the display unit 20 may move up while being positioned in proximity to the edge of the housing 30. Therefore, a space for containing an object above the housing 30 in front of the screen of the display unit 20 is eliminated, and thus the screen can be prevented from being blocked by the object positioned above the housing in front of the screen.

Alternatively, on the contrary, the display unit 20 may be disposed in such a way that the 'front' is a direction directed toward +z-axis and the 'back' is a direction directed toward −z-axis.

In the rollable display devices according to an embodiment, source PCBs 120 may be disposed on at least a portion of the rear surface (inside where the display unit 20 is wound on the roller) of the display unit 20. The source PCBs 120 may be spaced apart from the neighboring one.

Signal lines for transmitting digital video data and timing control signals, which are transmitted from a timing controller board 105, may be disposed on at least one source PCB 120. The source PCB 120 may be connected to the display panel 10 by a source chip-on film (COF) 123. The source COF 123 connected to one side of the source PCB 120 may be extended to the active region of the display panel 10 and connected to the display panel of the display unit 20.

A seating portion 379 may be formed on an outer circumference of the roller 143. The seating portion 379 may be formed such that a part of the outer circumference of the roller 143 is stepped. In this case, an accommodation space B may be formed inside the roller 143. The seating portion 379 may be positioned where the PCB 120 adjoins the roller 143 when the display unit 20 is wound on the roller 143.

When the display unit 20 is rolled up, the source PCB 120 may be accommodated in the accommodation space B formed by the seating portion 379. Hence, it is possible to prevent damage to the source PCB 120 when the roller 143 is rolled up.

The timing controller board 105 may be mounted inside the roller 143. The timing controller board 105 and the source PCB 120 may be electrically connected by an FFC cable 117.

The roller 143 may include two bodies, rather than one body, that is, an upper roller 331 and a lower roller 337. The upper roller 331 and the lower roller 337 may be assembled together by various methods without any restraint. For example, they may be screwed together.

The timing controller board 105 may be mounted between the upper roller 331 and the lower roller 337. The FFC cable 117 may be connected to the timing controller board 105 and the source PCBs 120 through a hole 331a positioned in the upper roller 331.

With this configuration, the timing controller board 104 rotates together with the roller 143, thereby preventing the FFC cable 117 from being entangled. Also, the timing controller board 105 is mounted inside the roller 143, thereby saving space.

Moreover, a main board and a power supply may be disposed inside the housing to drive the display unit 20. For example, they may be mounted on an inner wall surface of the housing. The timing controller board 105 may be connected to the main board and the power supply through wiring.

With reference to FIGS. 5 and 6, configuration for moving up and down the display unit 20 will be described below. FIG. 5 illustrates an overall appearance of a rollable display device according to an embodiment, and FIG. 6 illustrates an appearance of the rear of a rollable display device of FIG. 5.

In an embodiment, the rollable display device 100 may include a link assembly LA for moving up and down the display unit 20.

The link assembly LA may be driven by a motor. In the first state, the link assembly LA may allow the display unit 20, that is positioned in a folded state inside the housing 30, to be positioned inside the housing 30 while being rolled on the roller 143. In the second state, the display unit 20 may be unfolded and may be exposed out of the housing 30.

The housing 30 may function as a mounting where the link assembly LA and a motor assembly 137 are installed, and may support the link assembly LA and the motor assembly 137.

The housing 30 may include a first base 31 and a second base 33. The first base 31 and the second base 33 may face each other at a predetermined distance between them. For reference, FIG. 5 illustrates that the first base 31 is removed so that the roller 143 is visible.

The roller 143 may be disposed between the first base 31 and the second base 33, and both ends thereof may be axially connected to the housing 30 so as to rotate clockwise or counterclockwise. Accordingly, the roller 143 may rotate with respect to the central axis of the roller.

The link assembly LA may be disposed on the first base 31. The link assembly LA may function to give support so that the display unit 20 moves up and down. The link assembly LA may move up and down a supporter 75 coupled to the upper part of the display unit 20.

An upper end of the display unit 20 may be fixed to the supporter 75, and a lower end thereof may be fixed to the roller 143. When the link assembly LA is unrolled (or unfolded), the link assembly LA may support the display unit 20 at the rear surface of the display unit so that the display unit 20 is unfolded neatly without folds.

The motor assembly 137 may be positioned where the link assembly LA is connected to the housing 30. The motor assembly 137 may be driven to move up and down the link assembly LA. The motor assembly 137 may receive an electric signal and convert the electric signal into a physical force. The motor assembly 137 may transmit rotational energy to the link assembly LA and change it from the first state to the second state.

The link assembly LA may include the supporter 75 and a pair of links 73 supporting both sides of the supporter 75.

The supporter 75 fixes ends of the display unit 20. Thus, the display unit 20 may move up and down in accordance with the up and down operation of the supporter 75.

The link 73 may include an upper link 73a and a lower link 73b, and may have a bar shape. The upper link 73a may be disposed at an upper part, and the lower link 73b may be disposed at a lower part.

The upper ink 73a and the lower link 73b may be connected through a joint 152. One end of the upper link 73a may be fastened to the supporter 75, and other end of the upper link 73a may be fastened to the joint 152. Also, one end of the lower link 73b may be rotatably and axially connected to the motor assembly 137, and other end of the lower link 73b may be fastened to the joint 152.

The joint 512 may include gears (not shown) that are installed at the upper link 73a and the lower link 73b, respectively. The gear of the upper link 73a and the gear of the lower link 73b may engage each other. Thus, the links 73 may be configured to move symmetrically with respect to the joint 512.

The link 73 may be provided on each of the left and right sides, and may operate as a pair. That is, the display unit 20 may move up and down in an upright position without tilting or creasing only when the left link and the right link are controlled to have the same momentum.

With this in consideration, in an embodiment, the link assembly LA may further include a shock absorber 72 supporting the link 73. One end of the shock absorber 72 may be rotatably and axially connected to the link 73, more precisely, the lower link 73b, and the other end may be rotatably and axially connected to the first base 31. In an exemplary embodiment, the shock absorber 72 may include an oil hydraulic cylinder, a pneumatic cylinder (or an air cylinder), or an actuator. The shock absorber according to this construction may include a piston and a cylinder, and the cylinder may be filled with oil or gas.

With reference to FIGS. 6 to 8, an operation of the ink assembly LA will be described below. FIGS. 7 and 8 illustrate a link assembly in a folded state.

In the rollable display device 100 according to an embodiment, the links 73 may perform a rotating/pivoting motion by the operation of the motor assembly 137, and, as a result, the supporter 75 may operate move up and down.

The rotary motion of the motor assembly 137 may be performed so that the links 73 rotate or pivot in a direction, in which the links 73 stand upright with respect to the base 31, by a gear configuration (not shown) disposed between the motor assembly 137 and the lower link 73b.

For example, an angle between the upper link 73a and the lower link 73b which are connected with respect to the joint 152 as the axis of the motor assembly 137 rotates may increase or decrease. Such an operation for decreasing or increasing the angle between the upper link 73a and the lower link 73b with respect to the joint 152 as the upper link 73a and the lower link 73b are folded and unfolded may be referred to as a pivot operation.

As the links 73 pivot, a top case 950 may move in a direction of +y-axis. Hence, the display unit 20 whose one end is connected to the top case 950 may move upward while being unrolled from the roller 143.

As the links 73 pivot in a direction in which they stand upright with respect to the base 31, a length of the shock absorber 72 varies. When the links 73 are unfolded, the shock absorber 72 whose one end is connected to the lower link 73b is extended in its longitudinal direction, which may increase oil pressure and support the links 73 to maintain an upright position.

When the motor assembly 137 pivots the lower link 73b in a direction (clockwise) opposite to the direction in which the lower link 73b stands upright with respect to the base 31, the angle between the lower link 73b and the upper link 73a may decrease. As a result, the supporter 75 may move downward toward the −y-axis, and a part of the display unit 20 may be rolled on the roller 143. Also, as the motor assembly 137 pivots the lower link 73b in a direction opposite to the direction in which the lower link 73b stands upright with respect to the base 31, the length of the shock absorber 72 may decrease.

As such, as the lower link 73b rotates clockwise or the links 73 pivot, a distance between the joint of the left link and the joint of the right link may decrease. When the distance has a minimum value, the display unit 20 may be completely accommodated in the housing. On the contrary, when the distance between the joint of the left link and the joint of right link has a maximum value, the links 73 may be brought to a fully upright position (90 degrees between the links and the base), thereby fully unfolding the display unit 20.

The display unit 20 according to an embodiment is described in more detail below with reference to the accompanying drawings. FIG. 9 illustrates an appearance of the display unit 20 configured to roll according to an embodiment, and FIG. 10 illustrates a cross-section taken along line B-B' of FIG. 9.

Referring to FIGS. 9 and 10, the display unit 20 may be configured such that the flat display panel 10 is attached to the module cover 15 in a face-to-face manner. For example, the display panel 10 may be configured such that it is rolled on or unrolled from the roller by rotating around the x-axis direction in the drawing.

The display panel 10 may be a flexible organic light emitting diode panel, by way of example, but is not limited thereto. For example, as long as a flexible and foldable display panel is used, it can be implemented as the display panel 10 without particular limitations.

The module cover 15 according to an embodiment may be configured to have the shape of a thin plate. The module cover 15 may have a thickness of about 0.1 mm to 0.2 mm, and its thickness may vary depending on with the size of the display panel 10. For example, the thickness of the module cover 15 may relatively decrease as the size of the display panel 10 decreases, and on the contrary, the thickness of the module cover 15 may increase as the size of the display panel 10 increases. The thickness of the module cover 15 may be adjusted depending on its structural stiffness. The thickness of the module cover 15 may increase so that the structural stiffness increases, and on the contrary, the thickness of the module cover 15 may decrease so that the structural stiffness decreases.

The thickness of the module cover 15 may be adjusted depending on the size of the roller 143, more precisely, a diameter of the roller 143 of a cylindrical shape. For example, when the diameter of the roller 143 increases, a radius of curvature required for the display unit 20 may increase correspondingly, and therefore the thickness of the module cover 15 may increase. On the contrary, when the diameter of the roller 143 decreases, the radius of curvature required for the display unit 20 may decrease correspondingly, and therefore the thickness of the module cover 15 needs to decrease.

The module cover 15 according to an embodiment may be formed of a thin metal plate having an excellent elastic restoring force, and more preferably, a metal plate material having a yield strain of 0.5% or more. For example, the module cover 15 may be made of titanium (Ti). When the module cover 15 is made of titanium, the module cover 15 can be implemented using a thin plate, and the thin plate can prevent the module cover 15 from being damaged from contamination due to an excellent corrosion resistance.

The yield strain (y) is a physical quantity defined as a value obtained by dividing yield strength by elastic modulus (yield strength/elastic modulus).

The yield strength can be adjusted during the manufacturing process, but the elastic modulus is a unique physical quantity determined for each material. Therefore, if the module cover 15 is made of titanium having a low elastic modulus, there is an advantage in that the yield strain can be easily increased.

In the present disclosure, the display unit 20 is rolled on the roller 143 or is unrolled from the roller 143, and thus serves as a display. However, a force for rotating the roller 143 is required to roll or unroll the display unit 20. When a yield strain of the module cover 15 is less than 0.5%, permanent deformation may occur due to a deformation force inherent in the module cover 15. In addition, since the force for rotating the roller 143 is excessively required, it is difficult to exert its proper function. Because of this, it is preferable that the yield strain of the module cover 15 is equal to or greater than at least 0.5%.

The yield strain is a quantitative number (or ratio) that can define flexibility of any material. The thicker the material, the lower the flexibility, and the thinner the material, the better the flexibility.

When the material is titanium, it is preferable that the thickness of the module cover 15 is 0.1 mm to 0.2 mm. When the thickness is less than 0.1 mm, it is impossible to form a structural strength and rigidity within a desired range. When the thickness is greater than 0.2 mm, the flexibility of the material is reduced, and the shape of the display unit cannot be maintained properly when the display unit is unfolded. Hence, it is practically impossible for the display unit to serve as a display.

When the module cover 15 is formed of titanium having a thickness of 0.1 mm to 0.2 mm, the display unit 20 can be stably wound on or unwound from the roller 143 without the permanent deformation even if the diameter of the roller 143 is configured to be 60 mm or less.

The module cover 15 thus configured may be attached to the display panel 10 using an adhesive 13 in a face-to-face manner. In this instance, it is preferable that an adhesive strength of the adhesive 13 is equal to or greater than 1,000 gf/25 mm. If the adhesive strength of the adhesive 13 is less than 1,000 gf/25 mm, there may occur a problem such as a gap between the display panel 10 and the module cover 15 due to an insufficient mechanical adhesive force when the display unit 20 is wound on or unwound from the roller 143.

The module cover 15 may further include bezel portions 17a and 17b formed above than the display panel 10 so as to protect the edges of the display panel 10.

The module cover 15 may include the first and second bezel portions 17a and 17b at both ends of the rotation axis (x-axis direction in the drawing). The bezel portions 17a and 17b may be elongated at the end of the module cover 15 along a direction (the z-axis direction in the drawing) intersecting the rotation axis.

In a preferable implementation, it is preferable that a thickness t1 of the bezel portions 17a and 17b is greater than a thickness t2 of the display panel 10. Hence, the edges of the display panel 10 can be protected from an impact due to the bezel portions 17a and 17b. In one example, the thickness of the display unit 10 may be 0.3 mm, and the thickness of the bezel portions 17a and 17b may be 1 mm or more.

The end of the display panel 10 may be spaced apart from the bezel portions 17a and 17b by a predetermined distance d1. The predetermined distance d1 forms a border gap to prevent the display panel 10 from interfering with the bezel portions 17a and 17b when the display panel 10 is deformed due to a stress generated in the display panel 10. As an example, when the display panel 10 is wound by rolling, a stress may be inherent in the display panel 10, and thus the display panel 10 may be deformed. Alternatively, the display panel 10 may operate or thermally expand or contract by an ambient temperature. In this instance, the display panel 10 can be prevented from interfering with the bezel portions 17a and 17b.

The module cover 15 (e.g., module cover assembly) may include a module cover 151 that may be made of titanium and a film portion 152 attached to the module cover 151 by a method such as a lamination, etc.

A material of the film portion 152 is not particularly limited, but is preferably configured to have an elongation greater than an elongation of the module cover 151. The module cover 151, which may be formed of a metal plate, may give an impact to the display panel 10 when the material itself is hard and wound on the roller. However, if the elongation of the film portion 152 positioned between the display panel 10 and the module cover 151 is better than the elongation of the module cover 151, when the display portion 20 is wound on the roller 143, the film portion 152 may elongate more than the module cover 151. Hence, the film portion 152 can effectively disperse the stress transferred from the module cover 151 to the display panel 10 and thus protect the display panel 10.

If the module cover 151 includes a first surface 151a facing toward the display panel 10 and a second surface 151b opposite the first surface 15a, the film portion 152 may include a first portion 152a formed on the first surface 151a and a second portion 152b formed on the second surface 151b, and a thickness S1 of the first portion 152a may be equal to or greater than a thickness S2 of the second portion 152b. Since the thickness S1 of the first portion 152a is greater than the thickness S2 of the second portion 152b, it is possible to effectively protect the display panel 10. In addition, since the first portion 152a and the second portion 152b are configured to have the different thicknesses, the overall thickness of the film portion 152 may be kept slim.

FIGS. 11 and 12 illustrate a planar appearance of a module cover constructing the module cover 15.

As an example, the module cover 151 may include one seamless plate material (see FIG. 11), or may include a plurality of plate materials 1511 to 1514 with a seam (Me).

For example, the module cover 151 may be configured to have a large area of 1,500 mm in horizontal width and 650 mm in vertical width. In this case, if flatness of the module cover 151 formed of a metal plate is not formed within a desired range, when the display panel 10 is attached to the module cover 15, the display panel 10 having a thin thickness may be formed by the module cover 15 and may be attached to the display panel 10.

Considering this point, the module cover 151 may include a plurality of plate materials.

When the module cover 151 includes the plurality of plate materials 1511 to 1514, the plate materials may be connected through butt welding. As illustrated in FIG. 13, the butt welding refers to a method of attaching two base materials 1512 and 1513 by welding a butt portion (Me) of the two base materials 1512 and 1513 in a state where the two base materials 1512 and 1513 are placed on the same plane to butt each other.

Since the plate materials 1511 to 1514 in the module cover 151 according to an embodiment are connected to each other through the butt welding as described above, the plate materials 1511 to 1514 may be disposed on the same plane and may have desired flatness even if the module cover 151 has the large area.

In this instance, when the module cover 151 is rolled, it is preferable that the plate materials 1511 to 1514 have the same size so that the same deformation force is generated in each plate material. Herein, the same size means that when the respective plate materials 1511 to 1514 have a rectangular shape, the respective plate materials 1511 to 1514 have the same width*length*thickness and thus have the same area.

When the plate materials are butt welded, it is preferable to perform spot welding rather than welding the seam (Me) as a whole. The spot welding refers to forming a welding portion (WP) in the shape of a point. As the seam (Me) is spot-welded, the seam (Me) may include a plurality of welding portions (WP) disposed along a longitudinal direction of the seam. It is preferable that the welding portion (WP) is formed at a predetermined distance from the neighboring welding portion along the longitudinal direction of the seam. Hence, the seam (Me) includes a welding portion and a non-welding portion. The reason for configuring the seam as described above is to effectively disperse the stress inherent in the module cover 151 by the rolling when the module cover 15 is rolled and to prevent the stress from being concentrated on the seam Me. For example, as the module cover 151 is rolled around the central axis (x-axis direction in the drawing), the deformation force may be condensed on the module cover 151. The deformation force may be concentrated on the weakest seam (Me) of the module cover 151, and the deformation force can be dispersed through a non-welded portion of the seam since a portion of the seam is not welded.

In comparison, if the seam (Me) is fully welded, there may occur a problem such as breakage of the welded portion due to the deformation force propagating to the seam (Me), or the seam portion may be crumpled.

When the module cover 151 includes the plurality of plate materials as described above, there is an advantage in that the module cover of the large area can be efficiently manufactured.

When the module cover 151 is in a rectangular shape having a long side (the side in the x-axis direction in the drawing) and a short side (the side in the y-axis direction in the drawing), the module cover 151 may include a notch 21 formed along an end of the short side. A plurality of notches 21 are formed at both ends in a direction (the x-axis direction in the drawing) intersecting a rolling direction (the x-axis direction in the drawing) of the module cover 151, and this is described in detail with reference to the drawings. A portion in which the notch 21 is formed may be implemented as a bending portion through a bending processing later.

With reference to the drawings, a notch is described in detail below. FIG. 14 enlargedly illustrates selectively an end at which a notch of a module cover is formed. FIG. 15 illustrates a process of forming a bending portion. FIG. 16 partially illustrates a bezel portion formed through a bending processing. A film portion is omitted in FIG. 16 for convenience of explanation.

Referring to FIGS. 14, 15 and 16, the module cover 151 may include the notch 21 formed at its end. When the module cover 151 is rolled on the roller, the notch 21 is configured so that the bezel portions 17a and 17b can be easily bent.

As an example, the notch 21 may be configured to have a predetermined length da1 in a second direction (the x-axis direction in the drawing) intersecting a rolling direction (the z-axis direction in the drawing) of the module cover 151. The length da1 of the notch 21 may be set depending on a width da2 of the bending portion 17a. In a preferable implementation, the length da1 of the notch 21 may be equal to or less than the width da2 of the bending portion 17a.

The end of the module cover 151 in which the notch 21 is formed may be bent toward the center of the module cover 151 to form the bezel portion 17a. However, if the length da1 of the notch 21 is greater than the width da2 of the bending portion 17a, the notch 21 may be further formed in the inside of the module cover 151 by passing the bezel portion 17a. In this case, the notch 21 may be visually recognized, and structural rigidity of the module cover 151 having the thin thickness may be reduced. In comparison, if the length da1 of the notch 21 is less than the width da2 of the bending portion 17a, the notch 21 may not be visually exposed from the rear surface of the module cover 151, and the notch 21 may also be selectively formed only on the bezel portion 17a.

The notch 21 may be spaced apart from the neighboring notch 21 by a predetermined distance in the first direction. In this case, a distance dt between the adjacent notches 21 may be determined depending on the size of the roller 143, that is, the diameter of the roller 143 having a cylindrical shape. For example, as the diameter of the roller 143 increases, the radius of curvature may increase in proportion to it. Therefore, the stress applied when the module cover 151 is rolled on the roller 143 can be reduced. Thus, the distance dt between the notches 21 may also increase. On the contrary, when the diameter of the roller 143 decreases, the stress applied to the module cover 151 rolled on the roller 143 increases in proportion to it. Accordingly, the bending may be performed easier by reducing the distance dt between the notches 21.

In addition, the shape of the notch 21 may be configured to have various shapes without any particular limitation. For example, the notch 21 may be formed in various shapes, such as a straight-line shape or a V-shaped groove, without any particular limitation, as illustrated in FIG. 14.

In a preferable implementation of the present disclosure, the bezel portions 17a and 17b may be formed by bending both ends of the module cover 151. This will be described in detail with reference to FIG. 15.

A first process S11 of forming the bezel portions 17a and 17b may be a notching process of forming the notch 21 by pressing both ends of the module cover 151. The notching refers to a press processing in which a part of a sheet is sheared using a mold. The notch 21 may have various shapes depending on a shape of the mold.

Next, a lamination process S12 may be performed to form a film portion on the notched module cover 151. Since the film is laminated after the notching process, the notch 21 formed through the notching process is configured so that the notch 21 is not visible to the outside, thereby enhancing the aesthetic feeling. Although it has been described that the film is laminated after the notching process, the notching process may be performed after laminating the film on the module cover 151.

Next, in a bending process S13, both ends of the notched module cover 151 may be bent to the inside of the module cover 151 to form the bezel portions 17a and 17b.

According to this, the notches formed in the bezel portions 17a and 17b are configured such that the notches are visually invisible, and thus can enhance the aesthetic feeling.

With reference to FIGS. 17 and 18, an operation of a display unit including a bezel portion is described below. FIG. 17 illustrates selectively only a display unit and a roller. FIG. 18 illustrates an operation of a notch formed in a bezel portion when a display unit is rolled on a roller. In FIG. 17, the notch is not actually seen to the outside by the film portion, but is shown in FIG. 17 for convenience of explanation.

Referring to FIGS. 17 and 18, the display unit 20 may be rolled on or unrolled from the roller 143 by the operation of the link assembly as described above, and thus the display unit 20 may move up and down.

In a preferable implementation, the display unit 20 may be wound on the roller 143 so that the front surface of the display faces outward when the front surface of the display is wound on the roller 143. As described above, when the display unit 20 is wound to face outward, the display unit 20 including the bezel portions 17a and 17b may be bent more easily on the roller 143.

More specifically, as the roller 143 rotates counterclockwise and clockwise, the display unit 20 moves up and down (in the y-axis direction of the drawing).

The display unit 20 structurally supports the display unit 20, and bezel portions 17a and 17b are further formed at both ends of the display unit 20 in the up-down direction of movement so as to protect the display panel 10. However, as the bezel portions 17a and 17b are formed at both ends of the display unit 20, an imbalance in stress occurs when the display unit 20 is wound on the roller 143, and thus the display unit 20 may crumple or wrinkle when the display unit 20 is rolled on or unrolled from the roller 143.

However, because the notch 21 is formed in the bezel portions 17a and 17b along a rotation axis direction (the z-axis direction in the drawing) of the roller, i.e., the rolling direction of the display unit 20, the display unit 20 can be easily folded. In this instance, because the display unit 20 is wound so that the display unit 20 faces the outward, the bezel portions 17a and 17b may also be bent to face the outward. In this instance, the notch 21 formed in the bezel portions 17a and 17b is in a state illustrated in (A) when the display unit 20 is unfolded, but the bezel portions 17a and 17b are bent according to a surface 143a of the roller 143, i.e., the radius of curvature of the roller 143 when the display unit 20 is rolled on the roller 143.

In this instance, since the display unit 20 is bent to face outward, the bezel portions 17a and 17b are positioned in the opposite direction facing toward the roller 143. In this instance, the outside of the bezel portions 17a and 17b is stretched while the inside is contracted. However, since the notch 21 formed in the bezel portions 17a and 17b is formed outside the bezel portions, the outside of the bezel portions 17a and 17b may be stretched without any resistance while the notch 21 is stretched along its stretch direction (arrow direction in the drawings). As a result, even if the display unit 20 includes the bezel portions 17a and 17b at its both ends, the display unit 20 can be easily bent on the roller 143.

Since the display unit 20 is bent to face outward, a width nw1 of the notch 21 when the display unit 20 is unrolled may be less than a width nw2 of the notch 21 when the display unit 20 is unrolled.

The embodiments of the present disclosure described above are not exclusive or distinct from each other. The embodiments of the present disclosure described above can be used together or combined in configuration or function.

The above detailed description is merely an example and is not to be considered as limiting the present disclosure. The scope of the present disclosure should be determined by rational interpretation of the appended claims, and all variations within the equivalent scope of the present disclosure are included in the scope of the present disclosure.

The invention claimed is:

1. A rollable display device comprising:
a roller;
a display unit rolled on the roller, the display unit including a display panel and a module cover assembly attached to the display panel to face the display panel;
a link assembly configured to move up and down the display unit; and
a motor assembly configured to drive the link assembly, wherein the module cover assembly includes:
a module cover; and
a film portion provided on the module cover and having an elongation greater than an elongation of the module cover to disperse stress transferred from the module cover to the display panel,
wherein the roller has a diameter equal to or less than approximately 60 mm,
wherein the module cover assembly is attached to the display panel by an adhesive, and
wherein an adhesive strength of the adhesive is equal to or greater than approximately 1,000 gf/25 mm.

2. The rollable display device of claim 1, wherein the module cover has a thickness of approximately 0.1 mm to 0.2 mm and is made of titanium (Ti).

3. The rollable display device of claim 2, wherein the module cover includes one seamless plate material or a plurality of plate materials that are attached to each other at a plurality of seams.

4. The rollable display device of claim 1, wherein the module cover includes a plurality of plate materials,
wherein the display unit is configured to be rolled on the roller in a first direction, and
wherein each of the plurality of plate materials is spot welded to a neighboring plate material among the plurality of plate materials in a second direction substantially perpendicular to the first direction.

5. The rollable display device of claim 1, wherein the module cover includes a first surface facing toward the display panel and a second surface that is opposite to the first surface, and
wherein the film portion includes a first portion on the first surface and a second portion on the second surface.

6. The rollable display device of claim 1, wherein the display unit is configured to be rolled on the roller in a first direction,
wherein the module cover assembly includes:
a first end;
a second end opposite to the first end; and
a bezel portion at the first end and the second end, and
wherein the first end is spaced from the second end in a second direction substantially perpendicular to the first direction.

7. The rollable display device of claim 6, wherein the bezel portion has a thickness in a third direction that is equal to or greater than a thickness of the display unit, and
wherein the bezel portion extends from the first and second ends toward a center of the module cover.

8. The rollable display device of claim 7, wherein the bezel portion includes a plurality of notches that form a bending portion.

9. The rollable display device of claim 8, wherein the plurality of notches are spaced apart from each other by a predetermined distance in the first direction.

10. The rollable display device of claim 8, wherein a length of each of the plurality of notches in the second direction is equal to or less than a width of the bezel portion in the second direction.

11. The rollable display device of claim 8, wherein a width of each of the plurality of notches when the display unit is rolled on the roller is greater than the width of each of the plurality of notches h when the display unit is unrolled from the roller.

12. The rollable display device of claim 11, wherein the display panel is spaced apart from the bezel portion by a predetermined distance to allow for the increase in width of the plurality of notches from when the display unit is unrolled from the roller to when the display unit is rolled on the roller.

13. The rollable display device of claim 8, wherein the film portion is laminated on the module cover after the plurality of notches are formed such that the plurality of notches are covered by the film portion.

14. The rollable display device of claim 1, wherein the link assembly is pivotally fixed to the display unit.

15. A rollable display device comprising:
a roller;
a display unit rolled on the roller, the display unit including a display panel and a module cover assembly attached to the display panel to face the display panel;
a link assembly configured to move up and down the display unit; and
a motor assembly configured to drive the link assembly, wherein the link assembly includes:
a module cover; and
a film portion provided on the module cover and having an elongation greater than an elongation of the module cover to disperse stress transferred from the module cover to the display panel,
wherein the display unit is configured to be rolled on the roller in a first direction,
wherein the module cover assembly includes:
a first end;
a second end opposite to the first end; and a bezel portion at the first end and the second end,
wherein the first end is spaced from the second end in a second direction substantially perpendicular to the first direction,
wherein the bezel portion has a thickness in a third direction that is equal to or greater than a thickness of the display unit,
wherein the bezel portion extends from the first and second ends toward a center of the module cover,
wherein the bezel portion includes a plurality of notches that form a bending portion, and
wherein the film portion is laminated on the module cover after the plurality of notches are formed such that the plurality of notches are covered by the film portion.

16. A rollable display device comprising:
a roller;
a display unit rolled on the roller, the display unit including a display panel and a module cover assembly attached to the display panel to face the display panel;
a link assembly configured to move up and down the display unit; and
a motor assembly configured to drive the link assembly,
wherein the module cover assembly includes:
  a module cover; and
  a film portion provided on the module cover and having an elongation greater than an elongation of the module cover to disperse stress transferred from the module cover to the display panel,
wherein the module cover includes a plurality of plate materials that are attached to each other at a plurality of seams,
wherein the display unit is configured to be rolled on the roller in a first direction, and
wherein each of the plurality of plate materials is spot welded to a neighboring plate material among the plurality of plate materials in a second direction substantially perpendicular to the first direction.

* * * * *